(12) United States Patent
Fathimulla et al.

(10) Patent No.: US 7,339,726 B2
(45) Date of Patent: Mar. 4, 2008

(54) MODULATING RETROREFLECTOR ARRAY USING VERTICAL CAVITY OPTICAL AMPLIFIERS

(75) Inventors: Ayub Mohammed Fathimulla, Ellicott City, MD (US); Harry Stephen Hier, Sykesville, MD (US); Olaleye A. Aina, Columbia, MD (US)

(73) Assignee: Epitaxial Technologies, Baltimore, MD (US)

( * ) Notice: Subject to any disclaimer, the term of this patent is extended or adjusted under 35 U.S.C. 154(b) by 389 days.

(21) Appl. No.: 11/007,951

(22) Filed: Dec. 9, 2004

(65) Prior Publication Data

US 2007/0064296 A1 Mar. 22, 2007

(51) Int. Cl.
*H01S 3/00* (2006.01)
(52) U.S. Cl. ...................................... 359/344
(58) Field of Classification Search ................ 359/344
See application file for complete search history.

(56) References Cited

U.S. PATENT DOCUMENTS

| | | | | |
|---|---|---|---|---|
| 5,689,122 | A * | 11/1997 | Chandrasekhar | 257/184 |
| 6,001,664 | A * | 12/1999 | Swirhun et al. | 438/31 |
| 6,503,768 | B2 * | 1/2003 | Cho et al. | 438/21 |
| 6,538,808 | B1 * | 3/2003 | Tastavridis | 359/344 |
| 6,778,585 | B2 * | 8/2004 | Malone | 372/108 |
| 6,888,973 | B2 * | 5/2005 | Kolodziejski et al. | 385/14 |
| 6,898,219 | B2 * | 5/2005 | Malone et al. | 372/29.02 |
| 6,987,306 | B2 * | 1/2006 | Fathimulla et al. | 257/431 |
| 7,126,750 | B2 * | 10/2006 | Wasserbauer | 359/344 |
| 2003/0067675 | A1 * | 4/2003 | Wang et al. | 359/344 |
| 2004/0032647 | A1 * | 2/2004 | Wasserbauer | 359/344 |
| 2005/0089074 | A1 * | 4/2005 | Koelle et al. | 372/50 |
| 2007/0196113 | A1 * | 8/2007 | Fathimulla et al. | 398/212 |

OTHER PUBLICATIONS

G. C. Gilbreath, W. S. Rohinovich, T. J. Meehan, M. J. Vilcheck, R. Mahon, Ray Burris, M. Ferraro, I Sokolsky, J. A. Vasquez, C. S. Bovais, K. Cochrell, K. C. Goins, R. Barbchenn, D. S. Kutzer, K. Ikossi-Anastasiou, Marcos J. Montes, "Large-aperture multiple quantum well modulating retroreflector for free-space optical data transfer on unmanned aerial vehicles". Opt. Eng. 40(7) 1348-1356, Jul. 2001.

N.G. Creamer, G.C. Gilbreath, T.J. Meehan, M.F. Stell, M.J. Vilcheck, W.S. Rabinovitch, "Multi Quantum Well Retromodulators for Spacecraft-to-Spacecraft Laser Interrogation, Communication and Navigation", Proceedings, 15th Annual AIAA/USU Conference on Small Satellites, SSC01-V1-6, 2001.

S. Herrin, Lt. Col. R. Ewart, D. Mansell, M. Enoch, "Optical Tracking Telemetry and Commanding (TT&C) For Small Satellites", Proceedings, 13th Annual AIAA/USU Conference on Small Satellites, 1999.

* cited by examiner

*Primary Examiner*—Deandra M Hughes
(74) *Attorney, Agent, or Firm*—H. C. Lin Patent Agent (57) ABSTRACT

A vertical cavity semiconductor optical photoamplifer (VC-SOA) is used as a modulating retro-reflector (MRR) as a pixel in an array. The boundary of the cavity in the VCSOA forms a mirror for reflecting an incident light as an amplified output.

11 Claims, 7 Drawing Sheets

MODULATING RETROREFLECTOR ARRAY USING VERTICAL CAVITY OPTICAL AMPLIFIERS

BACKGROUND OF THE INVENTION

1. Field of the Invention

This invention relates to vertical cavity semiconductor optical amplifier (VCSOA) technology for free space optical communication, in particular to arrays of active modulating retro-reflectors.

2. Brief Description of Prior Art

In a co-pending U.S. patent application Ser. No. (10/621,208), it has been disclosed that photoreceivers using vertical cavity semiconductor optical amplifiers (VCSOA) as optical preamplifiers is capable of quantum limit sensitivities for free space optical communications networks. It has also been disclosed that all the components of a photoreceiver-optical amplifier, optical band-pass filter, and photodiode module can be monolithically integrated on a single chip. In this invention, we apply the optical preamplified receiver technology to modulating retro-reflectors (MRR), either as active MRR or as optically preamplified MRRs with which higher speeds, higher extinction ratios and longer ranges can be enabled for the same transmit power.

A retroreflector, often referred to as a corner cube, is an optical device that redirects an incoming light back along the direction of incidence. When a mechanism is added at the aperture of the retroreflector to modulate the incoming signal, the device is called an MRR. Although various modulating retro-reflectors such as the multiple quantum well (MQW) retroflectors, micro-electro-mechanical corner cube retroreflector, ferroelectric liquid crystal modulator, thin film diffractive modulating retroreflector, have been demonstrated [1,2,3], their performance is still limited to lower bandwidths and short haul ranges. One of the main drawbacks of current MRRs is the relatively large capacitance resulting from the need for large area and high retroreflected power. In addition, the high series resistance needed for large modulation depths limits the bandwidth Other drawbacks are: high cost, high losses, slow speed, limited bandwidth, low reflection efficiency.

For example Gilbreath, G. C., Bowman, S. R., Rabinovich, W. S., Merk, C. H., and Senasack, H. E have proposed a Modulating Retroreflector Using Multiple Quantum Well Technology (U.S. Pat. No. 6,154,299). The MQW modulators are based on PIN diodes, in which the intrinsic region consist of several (up to one hundred) very thin (~10 nm) alternate layers of narrow bandgap semiconductor material as the well and wide bandgap semiconductor material as the barrier. Since the wells are thin, the bands are quantized and the exciton induces a sharp absorption feature at a wavelength that is determined by a constituent materials and the structure. When a reverse bias is applied to the device, the electric field changes the exciton absorption feature shifting it to longer wavelengths with a drop in magnitude. Therefore, by varying the voltage to the device, the transmission near the band edge changes dramatically and the device can serve as an on-off shutter. The modulator is designed to work in transmissive or reflective mode at a wavelength of 1550 nm, compatible with many laser diode sources. However, the MRRs based on MQWs are passive and have as much a 3 dB reflective loss. The proposed VCSOA technology enables amplified retroreflected power, thus alleviating the range/bandwidth/modulation trade-offs of MRRs. In this invention, we have devised an approach for implementing a compact active MRR that involves either using the VCSOA or monolithic integration of VCSOA with optical modulator.

SUMMARY OF THE INVENTION

The objects of this invention are as follows:
1. A VCSOA operating in the reflection mode can be used as active MRR
2. Active MRR based on VCSOA arrays with up to 30 dB extinction ratio and speeds of 3 Gbps for a 128×128 pixelated array with greater than 500% enhancement in MRR range and greater than a factor of 30 improvement in bandwidth.
3. Optical amplifier (VCSOA) material and device structures for high active layer gain and low resistance mirror material that will result in high optical gain and low operating power.
4. A VCSOA operating in the transmission mode can be integrated with Quantum Well Modulator (passive MRR) to form an active MRR.
5. Optically preamplified MRR architecture that will enable the best trade-off between MRR size, speed, and range and extinction ratio.

These objects are achieved by applying VCSOA technology to MRRs, either as active MRR or as optically preamplified MRRs. In these applications, the incident radiation is reflected with an optical gain. This gain can be as high as 30 dB.

Use of a VCSOA in place of a standard multi-quantum well (MQW) modulator based passive MRR or in conjunction with an MRR is desirable because the gain enables an extremely favorable trade-off between the range, speed and the MRR area. For example, large area format arrays with diameters of 1 cm are needed for Free Space Optics (FSO). The speeds of such MRRs are only 1-10 Mbps. The extinction ratio of such a device is at best only 10:1. By applying our VCSOA technology to MRRs, either as active MRR or as optically preamplified MRRs, higher speeds, higher extinction ratios and longer ranges can be enabled for the same transmit power. Alternatively, it reduces the power requirement so that lower transmit powers are needed for currently possible ranges and speed.

DETAILED DESCRIPTION OF THE INVENTION

Figure 1A:
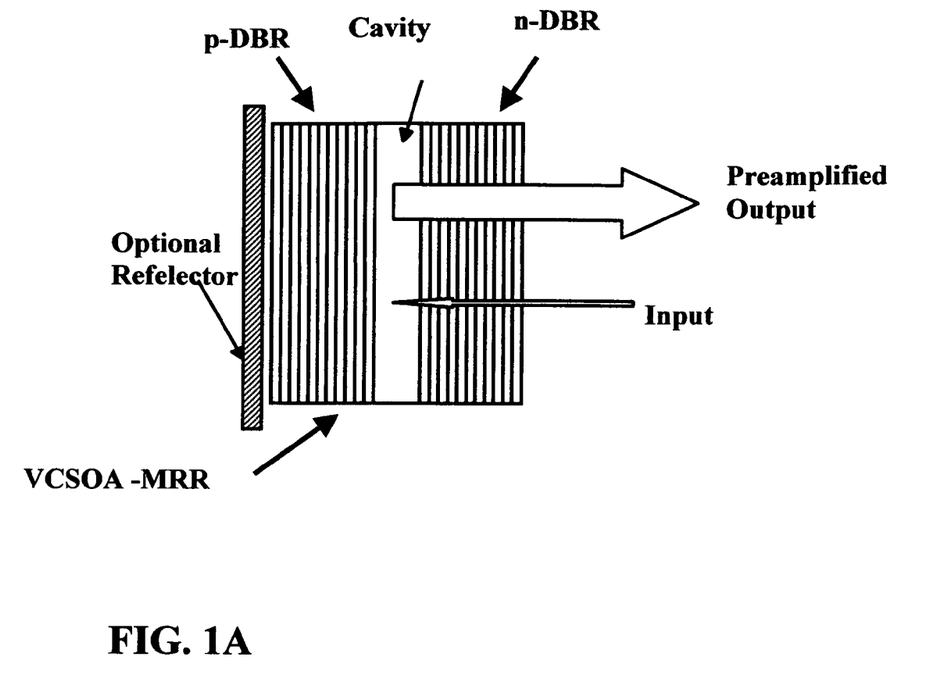
FIG. 1A shows the VCSOA MRR concept of the present invention.
Figure 1B:
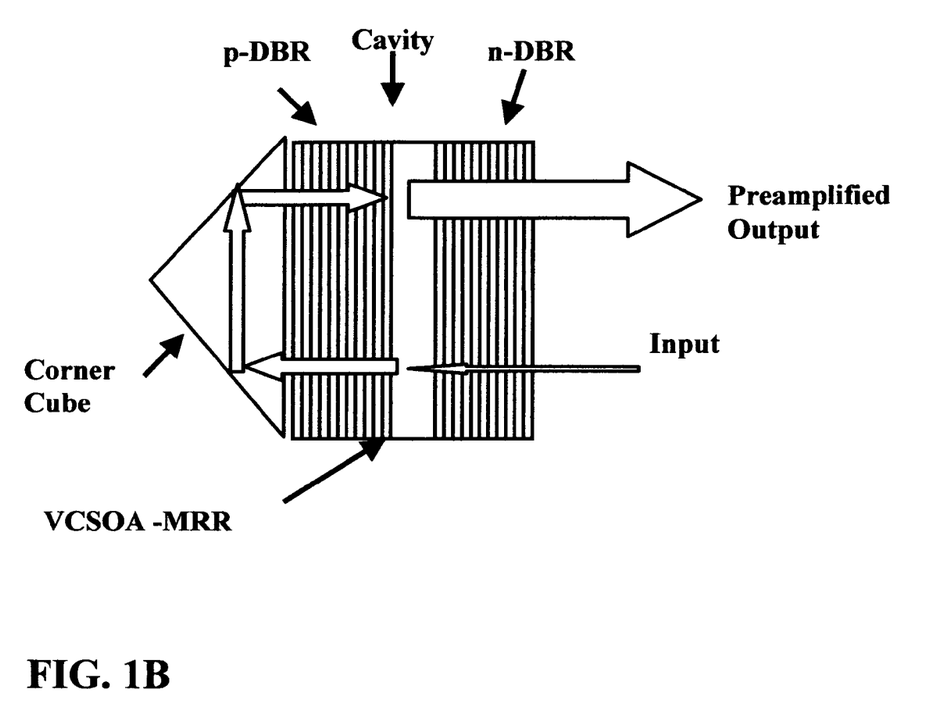
FIG. 1B shows the VCSOA MRR with corner cube

FIG. 1 shows the basic VCSOA MRR concept of the present invention. The approach builds on technologies described in the copending U.S. patent application Ser. No. 10/621,203. The basic pixel of the proposed active MRR is a VCSOA which is operated in the reflective mode. The same VCSOA when operated in the transmissive mode is used to produce the optical amplification. For MRR applications, the VCSOA is designed differently to have optimized reflective gain rather than the transmissive gain as with the VCSOA photoreceiver (U.S. patent application Ser. No. 10/621,203). For the latter, the number of bottom mirrors bounding the VCSOA boundary is minimized for maximum transmissive output, while for the active MRR, the number of top mirrors is minimized.

Figure 2:
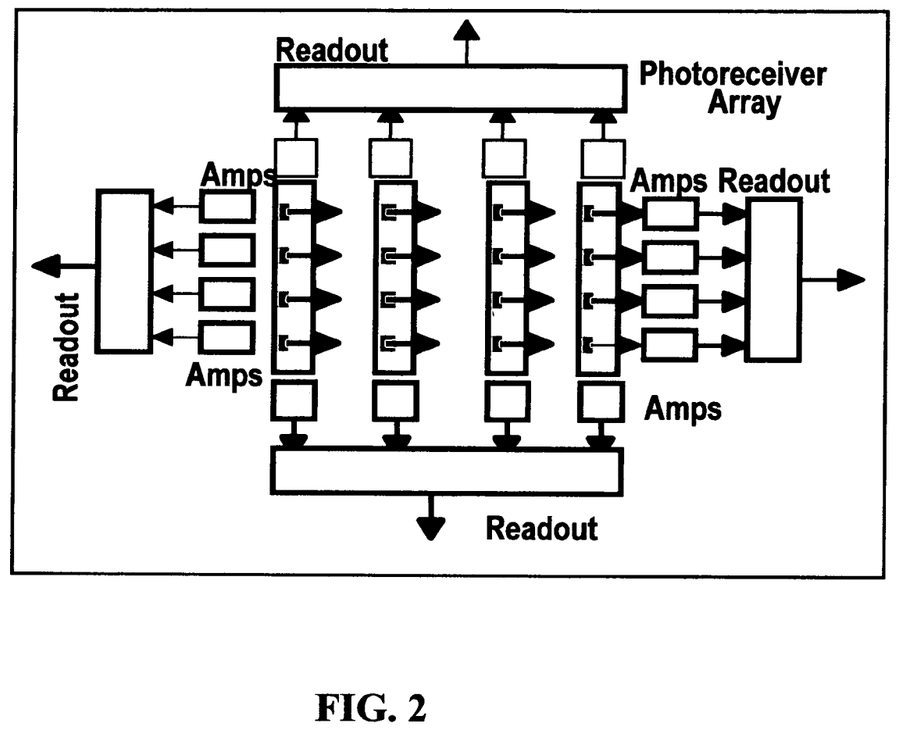
FIG. 2 shows the layout of a 128×128 active MRR array.

FIG. 2 shows a 128×128 active MRR array sample, based on VCSOA arrays which can be bump bonded onto readout circuits to produce an MRR with reflective gain. Each pixel will have 20-100 μm diameter with 10 μm spacing between pixels. A 20 μm diameter device with a 10 μm spacing have a 0.8 cm×0.8 cm aperture and a 75% fill-factor for a 128×128-element array. The fill-factor can be enhanced up to 250% by using microlens arrays.

Figure 3:
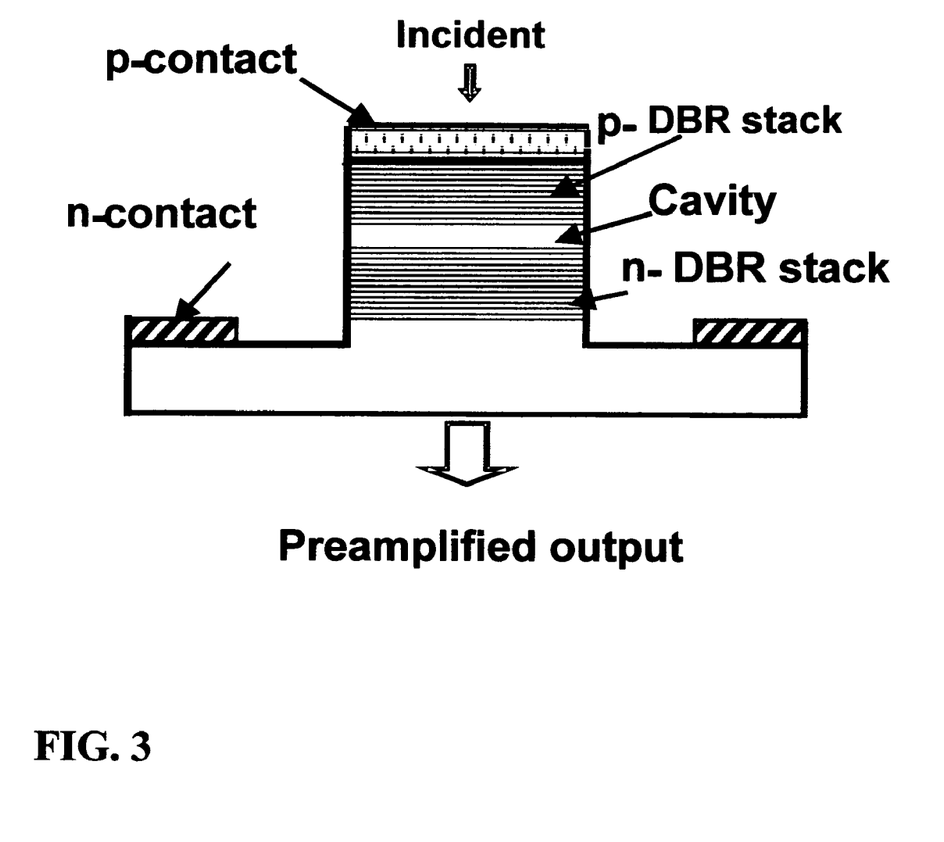
FIG. 3 shows the VCSOA concept sketch

The proposed active MRR (VCSOA MRR) operates by optical amplification and attenuation due to applied forward bias. The operation of the VCSOA MRR can be understood by considering the VCSOA device sketch shown in FIG. 3. It consists of an InAlAs/GaInAs quantum well sandwiched between two DBR mirror stacks. An incoming light signal is amplified when a forward bias of about 2-4 volt is applied to the anode and cathode of the VCSOA. With no bias, the incoming light signal is attenuated before retroreflection thus providing the required modulation. Unlike standard MRRs, the extinction ratio of the VCSOA MRR is determined by the optical gain and does not require high reverse bias to achieve high modulation depth. Extinction ratio as high as 30 dB (1000:1) is theoretically possible. By varying the forward bias, the active MRR pixel can be modulated. In the reverse bias, the VCSOA will act as a detector.

The performance of an MRR is highly dependent on its diameter and the required link range. For example, the optical power retroreflected from the MRR is given by [2]:

$$P_{retro} \alpha \frac{P_{laser} D_{retro}^4 D_{rec}^2 T_{atm}^2}{\theta_{div}^2 R^4} \quad (3)$$

where $P_{laser}$ is the output power of the interrogator, $D_{retro}$ is the MRR diameter, $D_{rec}$ is the receiver diameter, $T_{atm}$ is the atmospheric loss, $\theta$ is the beam divergence and $R$ is the range. The range clearly varies as the cube of the MRR diameter and inversely as the retroreflected power. As a result, for long range MRRs, the approach that has been used is to enlarge the MRR diameter. This in turn reduces the maximum data rate because the MRR capacitance is increased.

Figure 4:
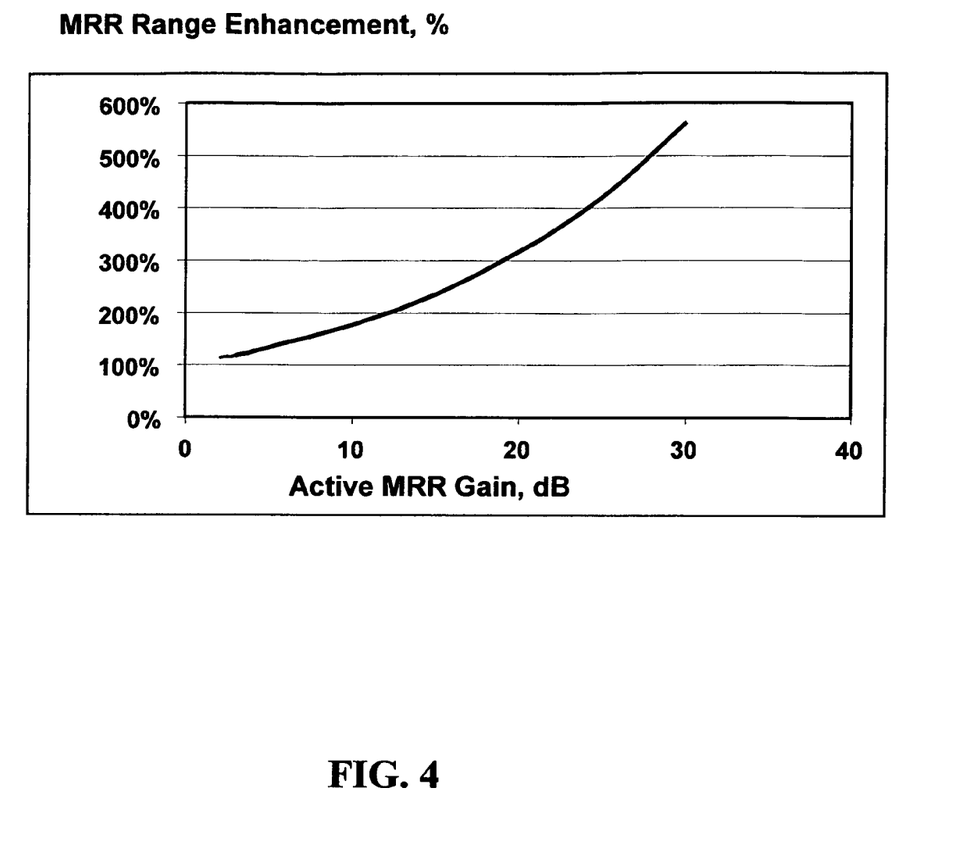
FIG. 4 shows the enhancement in range of the present invention
Figure 5:
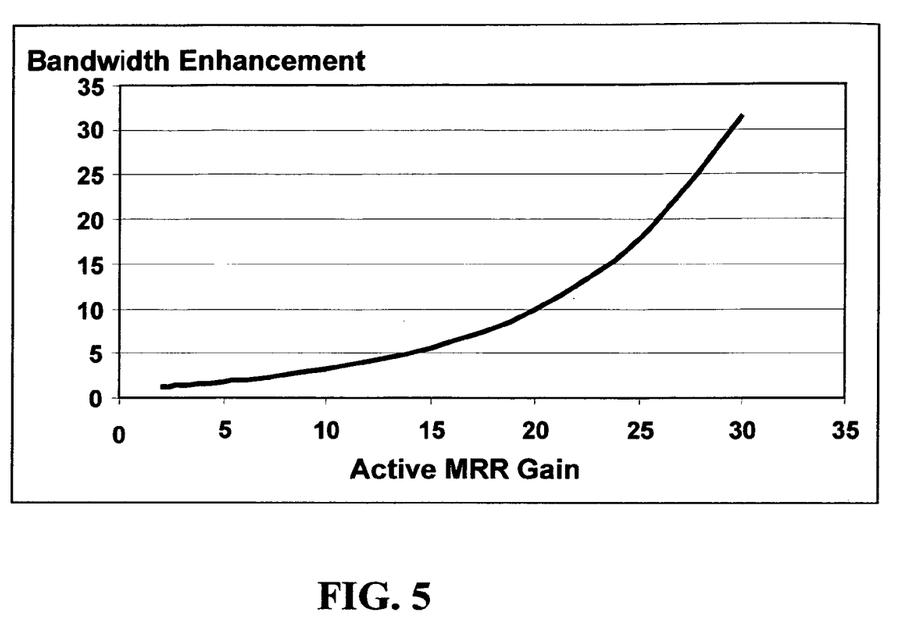
FIG. 5 shows the enhancement in bandwidth of the present invention

The advantage of the proposed VCSOA MRR is that the VCSOA gain is applied to $P_{retro}$ so that the MRR diameter does not have to be increased. As a result, there is an enhancement in the MRR range for constant MRR structural parameters. FIG. 4 shows the variation of the expected range enhancement as a function of the active MRR gain, showing that at least 500% improvement in range is possible with the proposed invention. Similarly, because the MRR diameter can be reduced for a desired range, the bandwidth and maximum data rate of the MRR will increase, because of a lower RC time constant. For the proposed MRR as FIG. 5 shows, the bandwidth enhancement can be greater than one order of magnitude.

Figure 6:
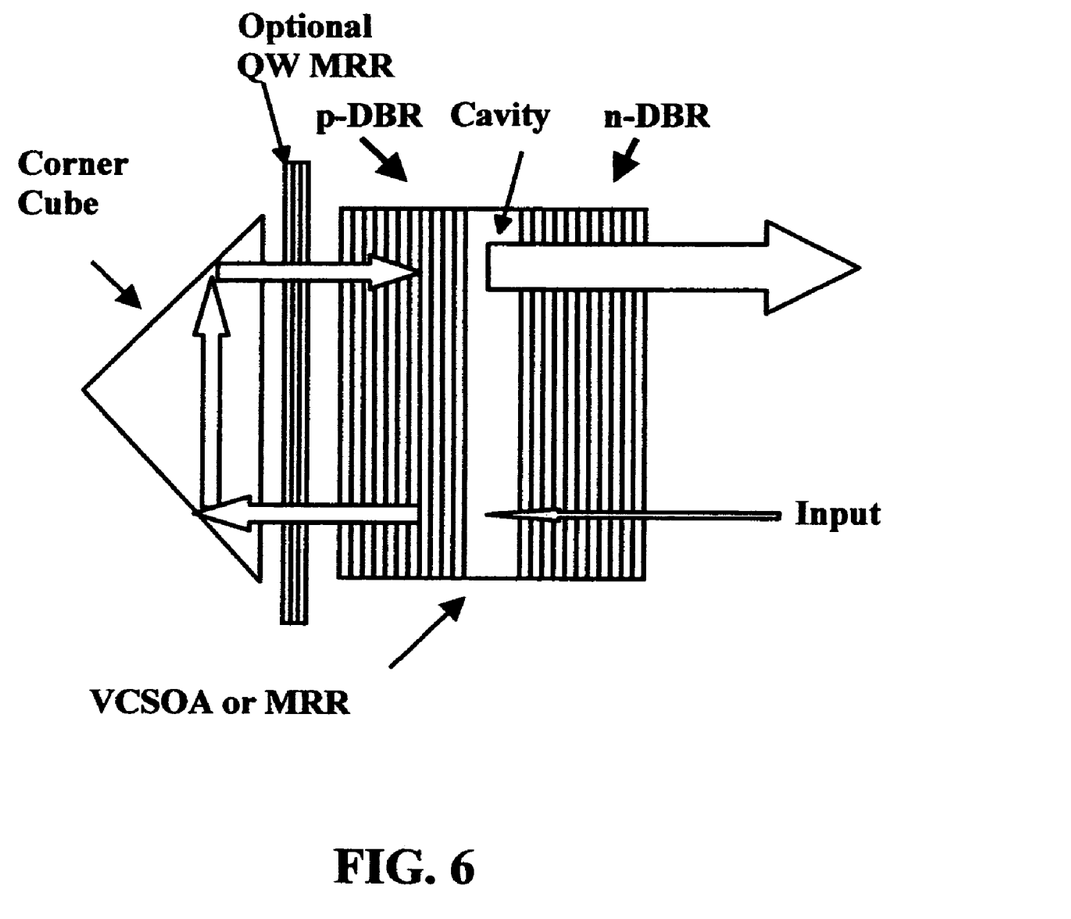
FIG. 6 shows alternate concept of optically amplified (VCSOA) MQW based MRR

In another embodiment of the present invention, an array of monolithic modulating retro-reflector with high gain can be realized by integrating arrays of VCSOA on top of the MQW electro-absorption modulator. FIG. 6 shows the concept of the optically preamplified MRR. For optically preamplified (active) MRR applications, the VCSOA is designed to have optimized transmissive gain as with the VCSOA photoreceiver. The optical preamplifier and modulator can be integrated using wafer bonding, selective epitaxy, vertically integrated epitaxy techniques. The direct integration, which provides the best yield involve growth of the optical amplifier on top of the optical modulator, followed by fabrication steps to delineate and deposit the circuit elements. The bonded integration approach requires a two-step growth process, which involves wafer bonding of the optical modulator structures to the optical amplifier structures.

Although only the use of InP based material systems and MRRs operating in wavelength of 1.55 μm has been described, the concept can be extended to other material structures such as GaAs, GaSb, GaN, SiGe, SiC etc. covering ultra violet (UV) to long wavelength infrared (LWIR) wavelength range. However, for monolithic MRR operating in wavelength greater than 2.5 μm, high index difference dielectric DBR may need to be used to minimize the total thickness of the VCSOA layers.

While the preferred embodiment of the invention has been described, it will be apparent to those skilled in the art that various modifications may be made to the embodiment without departing from the spirit of the present invention. Such modifications are all within the scope of the present invention.

The invention claimed is:

1. A modulating retro-reflector (MRR), comprising:
   a common substrate;
   an array of vertical cavity semiconductor optical amplifier (VCSOA),
   wherein said VCSOA forms a pixel in the array and is individually addressable,
   a reflector selected from a group consisting of a metal mirror and a corner cube at the back of the substrate;
   wherein said reflector reflects an incident light on VCSOA as an amplified output.

2. The MRR as described in claim 1, further comprising multiple number of said MRR as pixels of an array.

3. The MRR as described in claim 2, wherein said each of said pixels is forward biased for modulating said incident light.

4. The MRR as described in claim 2, wherein said each of said pixels is reverse biased for modulating said incident light.

5. The MRR as described in claim 4, wherein said VCSOA acts as a detector to monitor the currents from each pixel.

6. The MRR as described in claim 1, wherein said VCSOA has multiple layers stacked on a substrate having n-contact in the successive order of: an n-type Bragg reflector (DBR) stack, a cavity, a p-type DBR stack, and a p-type contact.

7. The MRR as described in claim 1, wherein said MRR operates in wavelengths in the range between UV (0.3 μm) and MWIR (3.5 μm).

8. The monolithic modulating retro-reflector (MRR) as described in claim 1, further comprising:
   an array of vertically integrated vertical cavity semiconductor optical amplifier (VCSOA), and an array of vertically integrated MQW electro-absorption optical modulator, wherein said reflector reflects light from said modulator.

9. The MRR as described in claim 8, wherein said optical preamplifier and said optical modulator are integrated using wafer bonding, vertical epitaxial techniques.

10. The MRR as described in claim 9, wherein said monolithic modulator and optical preamplifier are extensible to higher bit rates and other wavelengths.

11. The MRR as described in claim 8, wherein said optical preamplifier and said modulator are integrated using other material structures on InP, GaAs, GaSb, InAs, InSb, AlAs, AlSb, GaN, InN, AlN, SiC and combination of SiGe and Si technologies.

* * * * *